United States Patent [19]

Ryan et al.

[11] Patent Number: 4,689,551

[45] Date of Patent: Aug. 25, 1987

[54] TESTING WIRING HARNESSES

[75] Inventors: Harold Ryan, Ypsilanti; Scott G. Miller; John B. Schafer, both of Ann Arbor, all of Mich.

[73] Assignee: Tektite Corporation, Ann Arbor, Mich.

[21] Appl. No.: 772,798

[22] Filed: Sep. 5, 1985

[51] Int. Cl.[4] .......................................... G01R 31/02
[52] U.S. Cl. ...................................... 324/51; 324/66; 340/651; 379/26
[58] Field of Search .................................. 324/51, 66; 179/175.3 F; 340/650, 651, 652

[56] References Cited

U.S. PATENT DOCUMENTS

| 2,869,076 | 1/1959 | Evans et al. | 324/51 |
| 3,287,633 | 11/1966 | Mollo | 324/51 |
| 3,728,616 | 4/1973 | Cheek et al. | 324/66 X |
| 3,818,329 | 6/1974 | Reaves, Jr. | 324/51 |
| 4,596,904 | 6/1986 | Messenger | 179/175.3 F |

FOREIGN PATENT DOCUMENTS

1665708  4/1978  Fed. Rep. of Germany ........ 324/66

Primary Examiner—Reinhard J. Eisenzopf
Assistant Examiner—Robert W. Mueller
Attorney, Agent, or Firm—Rhodes and Boller

[57] ABSTRACT

Apparatus for testing wiring harnesses either during or after the harness fabrication process comprises test points, each of which is connected to a corresponding terminal of the harness. Associated with the test points are a current source, a current sourcing means, a current sink, and a current sinking means. Each current sourcing means and current sinking means comprises a controlled conduction path which is selectively operable to a conductive state or a non-conductive state. The tester operates to test individual circuits of the harness for continuity and shorts. In doing this the controlling conduction paths are selectively operated in accordance with information correlating the wiring harness circuits with the test points. A current sensing means senses the present or absence of current during open and short circuit tests and provides appropriate indicator signals to indicate opens or shorts if such faults are present. The apparatus can also be used to test for resistance and unidirectional conductivity devices such as diodes which may be present in a wiring harness.

10 Claims, 10 Drawing Figures

TESTING WIRING HARNESSES

BACKGROUND AND SUMMARY OF THE INVENTION

This invention relates to testing wiring harnesses.

Wiring harnesses are utilized in electrical systems to interconnect various remotely located components and devices of the system. In the automotive field for example, wiring harnesses connect various electrical devices at various locations in a vehicle into operative circuits. Such wiring harnesses are pre-fabricated assemblies which consist of a number of individual wires bundled together and having termination points for connection to the various respective electrical components and devices. A typical wiring harness may for example comprise a number of individual connector plugs at various locations which contain termination points for connection with termination points of mating connector plugs on components and devices. Certain connector plugs may provide for connection with mating connector plugs of other wiring harnesses. In this way wiring harnesses form a network to interconnect the various components and devices into an operative electrical system. A complicated wiring harness may comprise many individual electrical circuits and many individual connectors.

Wiring harnesses are fabricated with the use of manual labor in many instances. As such, the assembly process is susceptible to human error. In order to minimize and hopefully eliminate completely the occurrences of such errors, the use of testing apparatus is desirable to insure that the wiring harness is properly assembled. If an improperly assembled wiring harness is installed in a vehicle, the task of repairing the harness can involve a substantial amount of time and expense because not only can it be difficult to trace the fault, but removal of an installed harness and its subsequent reinstallation are often considerably more difficult than making the electrical repair of the harness.

Therefore, checking of a wiring harness at different stages of its fabrication process is a desirable means to guard against an improperly fabricated harness. Although such testing of harnesses involves an additional operation or operations, and hence is an addition to the piece cost, it can in the long run be cheaper than the substantial costs which will typically be required to repair improperly fabricated harnesses after they have been installed in vehicles. This consideration renders usage of testing equipment desirable and cost-effective. If testing can be performed with greater reliability and speed, this serves to make the testing procedures even more cost-effective. Versatility of testing apparatus makes it still more cost-effective.

The present invention is directed to a new and improved means for testing wiring harnesses which possesses significant advantages over other types of test equipment. It is adaptable to perform testing during and/or after the fabrication of a wiring harness. It is readily adaptable to different harness configurations so that a single test apparatus can be used to check many different types of harnesses. The invention can be embodied in a compact, portable unit. It advantageously makes use of solid-state devices for size, reliability, low power consumption and speed.

One of the aspects which makes the present invention especially advantageous is the test circuit configuration for conductivity testing of the individual circuits of a wiring harness. For the most part conductivity testing involves checking the wiring harness for open circuits and short circuits. The configuration of the present invention is well-adapted to do not only open and short tests, but it also has the ability to test for other effects such as unidirectional conductivity which exists in the presence of unidirectional conductive devices (diodes) in a harness and such as resistance. High-speed operation is achieved by means of a microprocessor-based controller and accompanying electronically operated devices.

The foregoing features, benefits, and advantages of the invention, along with additional ones, will be seen in the ensuing description and claims which should be considered in conjunction with the accompanying drawings. The drawings disclose a preferred embodiment of the invention according to the best mode contemplated at the present time in carrying out the invention.

DESCRIPTION OF THE PREFERRED EMBODIMENT

Figure 1:
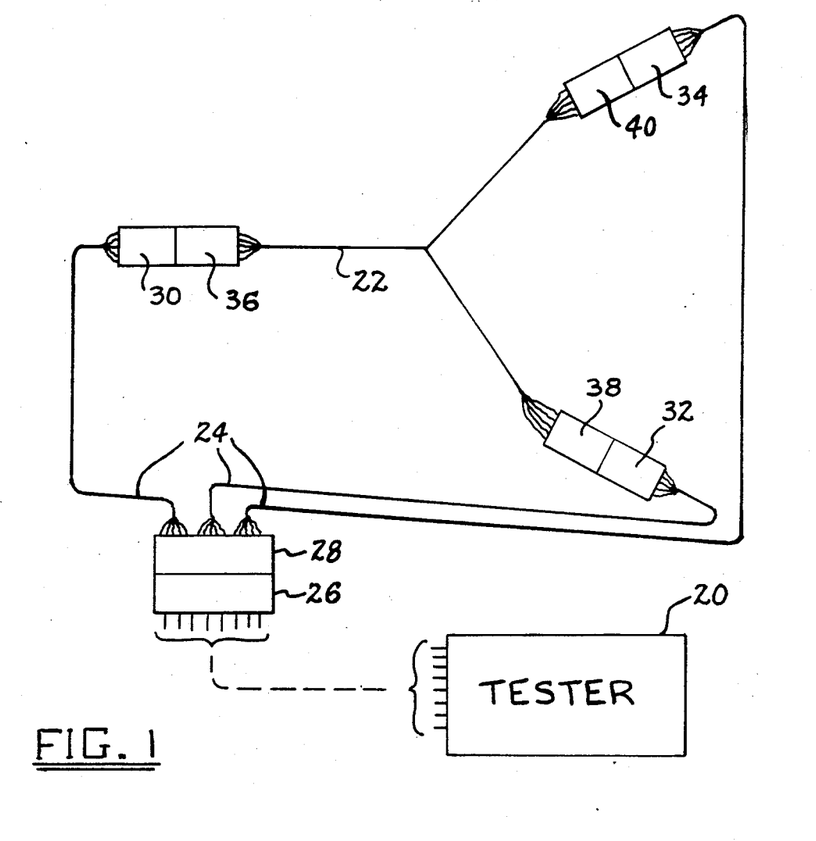
FIG. 1 is a schematic diagram illustrating a test unit of the present invention in use testing a wiring harness.

FIG. 1 illustrates test apparatus of the present invention, generally 20, testing a typical wiring harness, 22 generally.

Since test apparatus 20 comprises standardized connector plugs which have different geometrical configurations from the connector plugs of wiring harness 22, an adaptor harness 24 serves to interconnect test apparatus 20 and harness 22. The illustrated configuration shows a connector plug 26 of test apparatus 20 with which is connected a connector plug 28 of adaptor harness 24. The adaptor harness 24 in turn has additional connector plugs 30, 32 and 34, for example, which connect with corresponding connector plugs 36, 38, and 40 of wiring harness 22.

Wiring harness 22 comprises a number of individual circuits which are intended to be electrically separate from one another. In many instances these circuits will comprise a single wire such as the single wire 42 shown in FIG. 2. Wire 42 is shown to have two terminal points 44 and 46 respectively, and these terminal points would typically be at corresponding ones of the connector plugs 36, 38 and 40 of wiring harness 22. For example wire 42 might run between a particular terminal of connector plug 36 and a particular terminal of connector plug 40. The adaptor harness 24 will have respective connections to the terminal points 44 and 46 so as to connect them to particular terminals of connector plug 26.

It is of course to be appreciated that the foregoing illustration of FIG. 1 is merely exemplary for purposes of presenting principles of the invention. A typical wiring harness under test may have a substantial number of connector plugs and a substantial number of individual circuits. Moreover, it is possible for a wiring harness under test to be configured with terminals which are directly connectable with connector plug 26 so that use of an adaptor harness 24 is unnecessary. In most instances of usage of the invention however, it is contemplated that an adaptor harness 24 will be utilized. Although only one connector plug 26 is shown in test apparatus 20, it will be appreciated that this is entirely a function of the size of the test apparatus and that any given test apparatus constructed in accordance with principles of the invention may have single or multiple connector plugs.

Figure 3:
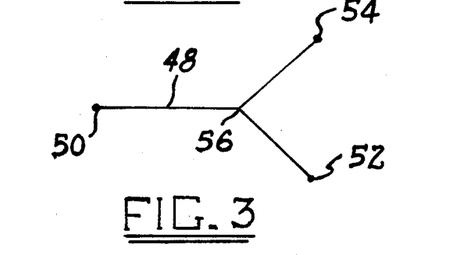
FIG. 3 is a schematic diagram illustrating another type of harness circuit which can be tested.

FIG. 3 depicts another type of circuit which may exist in a wiring harness. This circuit is referred to as a branch circuit. This is because the branch circuit has more than two terminal points and the illustrated example 48 of FIG. 3 has three such points 50, 52, and 54 respectively. For example, the point 50 could be at one of the terminals of connector plug 36, the terminal point 52 at one of the terminals of connector plug 38, and the terminal point 54 at one of the terminals of connector plug 40. These could comprise separate wire segments which are electrically connected at the common point 56 inside the harness.

The actual physical embodiment of any given branch circuit may assume any of several different configurations. For one example there could physically be a common connector point 56 within the harness where three wire segments from the respective terminal points 50, 52, and 54 are electrically joined, as by a solder point. An alternate but electrically equivalent construction could comprise a wire extending from terminal 50 to terminal 52 and a second wire from terminal 52 to terminal 54.

Figure 4:
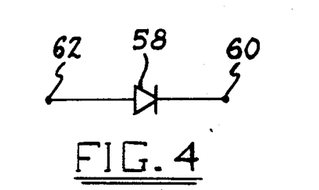
FIG. 4 is a schematic diagram illustrating still another type of harness circuit which can be tested.

FIG. 4 depicts another type of circuit which might exist in a harness, and this is shown to comprise a diode 58 having its cathode connected to a terminal point 60 and its anode connected to a terminal point 62. Although the diode is shown in a single wire circuit, it will be appreciated that a diode could be embodied in a branch circuit such as that in FIG. 3.

Figure 5:
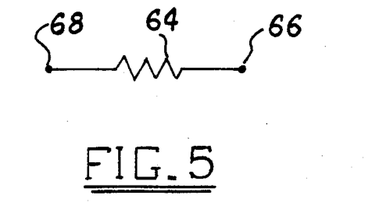
FIG. 5 is a schematic diagram illustrating yet a further type of harness circuit which can be tested.

FIG. 5 illustrates still another example which is of a resistance 64 which is provided between terminal points 66 and 68. Like the diode of FIG. 4, the resistance 64 of FIG. 5 can be embodied in either a single wire circuit such as in FIG. 2 or in a branch circuit such as in FIG. 3.

Figure 6:
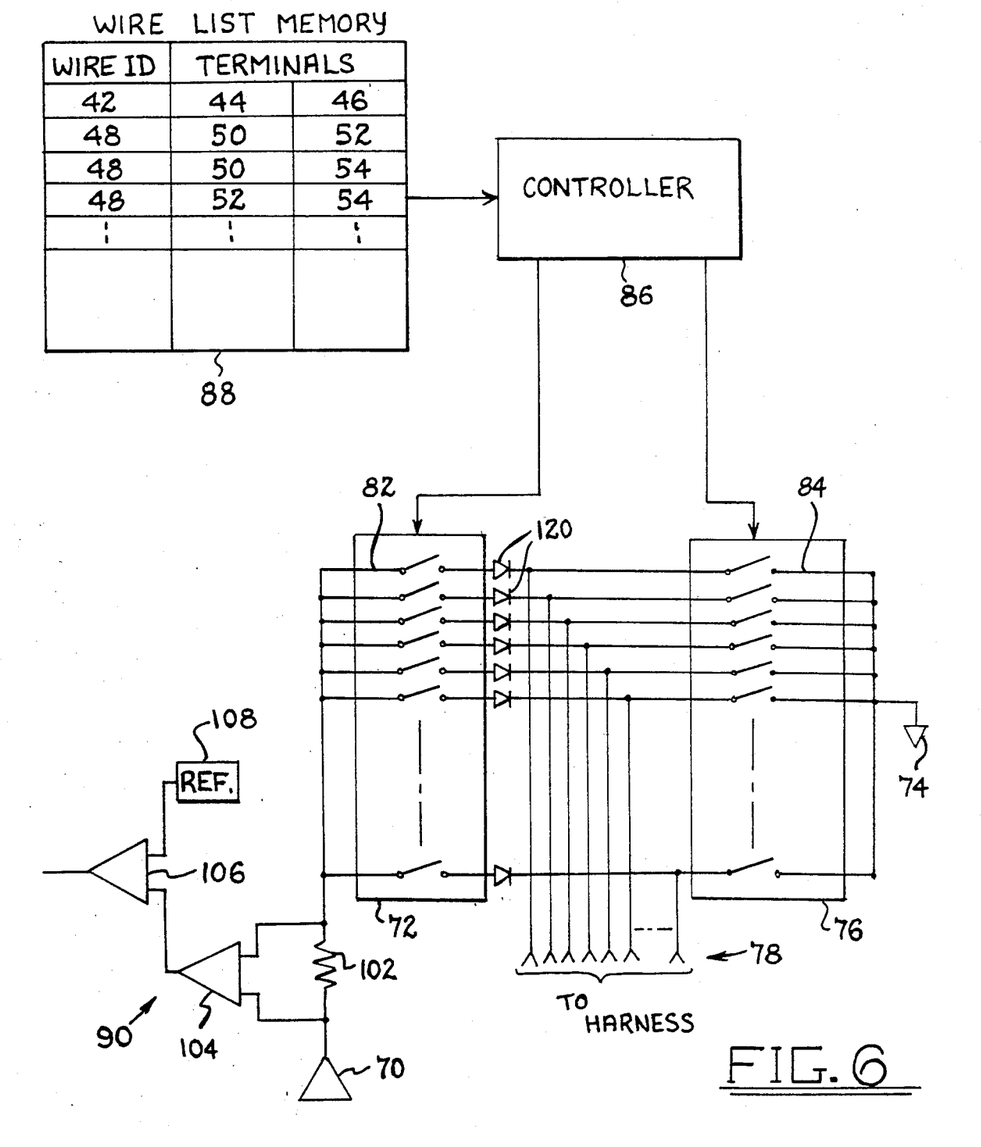
FIG. 6 is a general block diagram illustrating certain details of the test unit of FIG. 1.

FIG. 6 illustrates greater detail of test apparatus 20.

Test apparatus 20 comprises a current source 70, a current sourcing means 72, a current sink 74, and a current sinking means 76. It further comprises a number of test points 78 which are contained in connector plug 26. Each of test points 78 is in common with a corresponding particular terminal of current sourcing means 72 and a corresponding particular terminal of current sinking means 76.

Each of the means 72, 76 comprises a number of independent controlled conduction paths. In the case of current sourcing means 72, each of these controlled conduction paths 82 is from current source 70 to a corresponding particular test point 78. In the case of the current sinking means 76, each controlled conduction path 84 is from a corresponding particular one of test points 78 to current sink 74. Each of the controlled conduction paths 82, 84 in the respective current sourcing means 72 and current sinking means 76 is selectively operable to either a conductivity state or a non-conductivity state. Therefore, as portrayed in the drawing figures, each controlled conduction path 82, 84 may be represented schematically by a switch. In the conductivity state the switch is closed, and in the non-conductivity state the switch is opened.

The two means 72 and 76 are shown to be under the control of an associated portion of the tester which is identified generally as a controller 86. Controller 86 serves to selectively set the states of the individual controlled conduction paths 82, 84 and schematically, this corresponds to selective opening and closing of the individual switches. Also associated with the controller is a memory 88 which contains an identification of each circuit in a harness under test, including all respective termination points.

Although the current sourcing means, the current sinking means, the controller, and the memory are desirably modern electronic devices, principles of the invention do not depend upon the use of such technology, and a description of the principles can be more readily understood with reference to the selective opening and closing of the schematically portrayed switches representing the controlled conduction paths. Before embarking on that description, a brief explanation of an electronic embodiment will be presented.

Memory 88 is a standard electronic memory device which contains the harness circuit information in an electronically encoded format. Although the drawing shows the memory contents in a format correlated with the actual wiring harness itself for purposes of convenience in explanation, the electronic encoding and memory storage is accomplished in a conventional manner.

Controller 86 is microprocessor based and contains an operating program which acts upon the information in memory 88 to cause a test to be performed on a harness under test. The operating program for performing the test is written using conventional programming techniques with the objective of setting the various controlled conduction paths to the proper states for each part of the test based upon the particular harness configuration. In other words, controller 86 interfaces with the current sourcing means and current sinking means in a conventional manner to selectively control their controlled conduction paths in accordance with the information in the memory and the test sequence of the operating program. While the use of a microprocessor based controller is advantageous in promoting compactness, reliability, accuracy, speed, and low power consumption for example, the basic principles of the invention are generic to the use of mechanically operated switches, and hence the operational description will be given with reference to the opening and closing of the schematic switches which represent the controlled conduction paths.

Figure 2:
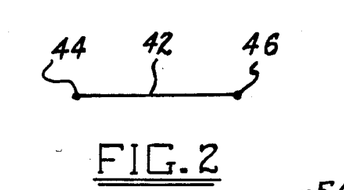
FIG. 2 is a schematic diagram illustrating one type of harness circuit which can be tested.
Figure 7:
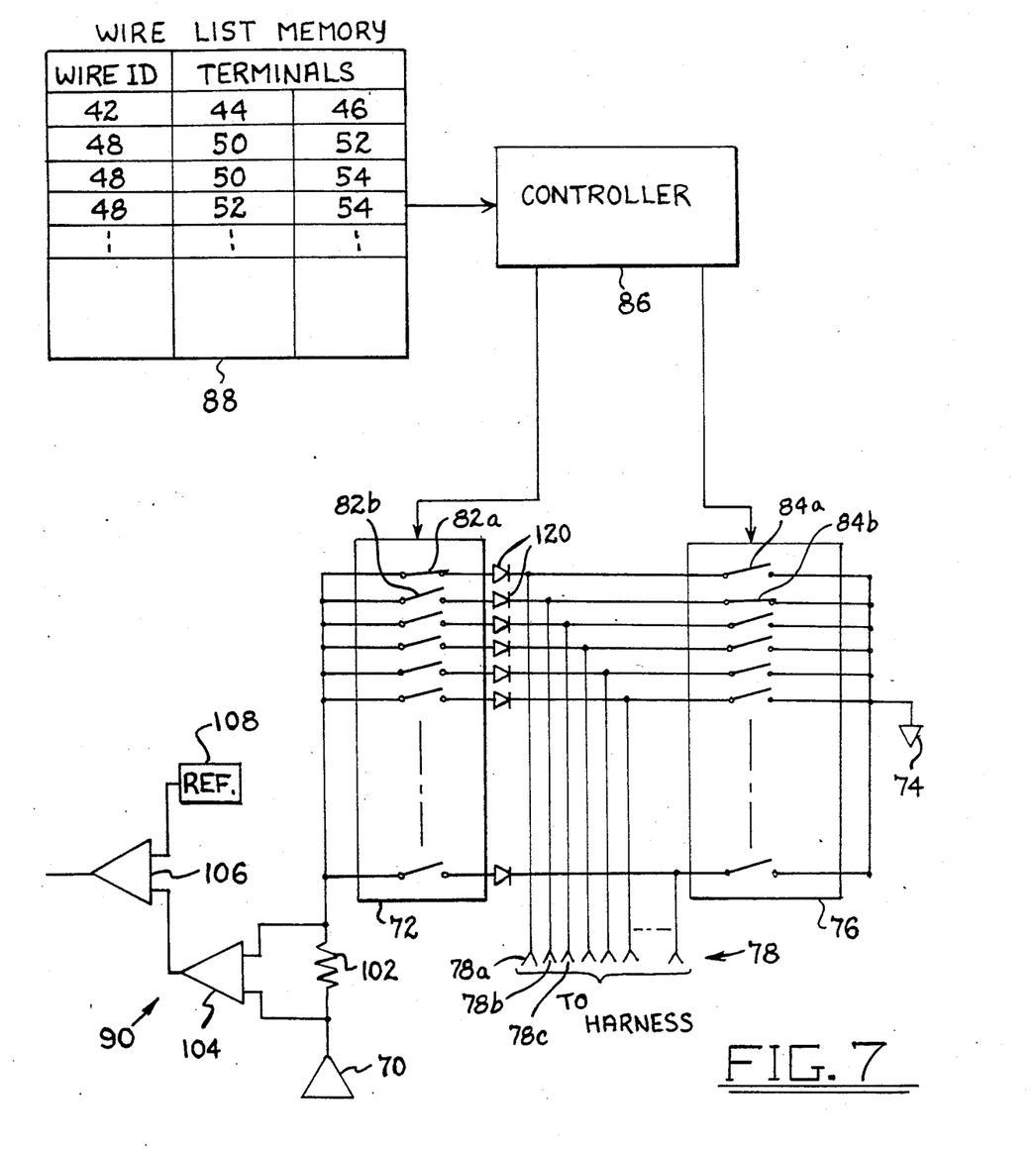
FIG. 7 is a schematic diagram of a portion of FIG. 6 illustrating schematically an operating condition for performance of an open circuit test on the type of circuit represented by FIG. 2.

FIG. 7 illustrates performance of an open circuit test on one of the wires of the harness which is of the type shown in FIG. 2.

The two terminals 44 and 46 of such a wire 42 are connected to respective test points 78, and they are further identified by the particular numbers 78a and 78b for convenience. The corresponding controlled conduction paths of current sourcing means 72 are further identified by the particular reference numeral 82a and 82b, and the corresponding controlled conduction paths of the current sinking means 76 are further identified by the particular reference numerals 84a and 84b.

In performing the open circuit test on wire 42, all controlled conducting paths of both the current sourcing means and the current sinking means are first operated to their non-conductivity states and then the two controlled conduction paths 82a and 82b are operated to their conductive states. If there is electrical continuity between the two terminals 44 and 46 through wire 42 then there will be a complete circuit from current source 70, through current sourcing means 72, through wire 42, through current sinking means 74, to current sink 76. Accordingly, a detection of current will indicate continuity.

If there were no continuity, for whatever reason, then there would be no current path from the current source to the current sink, and hence a lack of current would indicate an open circuit.

Associated with current source 70 is a current sensing means 90 which provides the indicator signal. Details will be explained later on.

It is also possible, and even desirable, to check the conductivity of the wire in the opposite direction. This is done, for the example of wire 42, by operating all controlled conduction paths to their non-conductivity states and then operating the controlled conduction paths 82b and 84a to their conductive states. If there is electrical continuity between the two terminals 46 and 44 through wire 42, then there will be a complete circuit from the current source through the current sourcing means via controlled conduction path 82b, through wire 42, through the current sinking means via controlled conduction path 84a, to current sink 76. A detection of current will indicate continuity.

It is to be appreciated that the actual manner of performing an open circuit test on a two-terminal wire may be done in either one or both of the directions just described. Where the test apparatus is all electronic, the inherent high-speed capability enables several repetitive checkings, if desired. Any particular manner of testing however will depend upon the specific nature of the operating program which is utilized.

Figure 8:
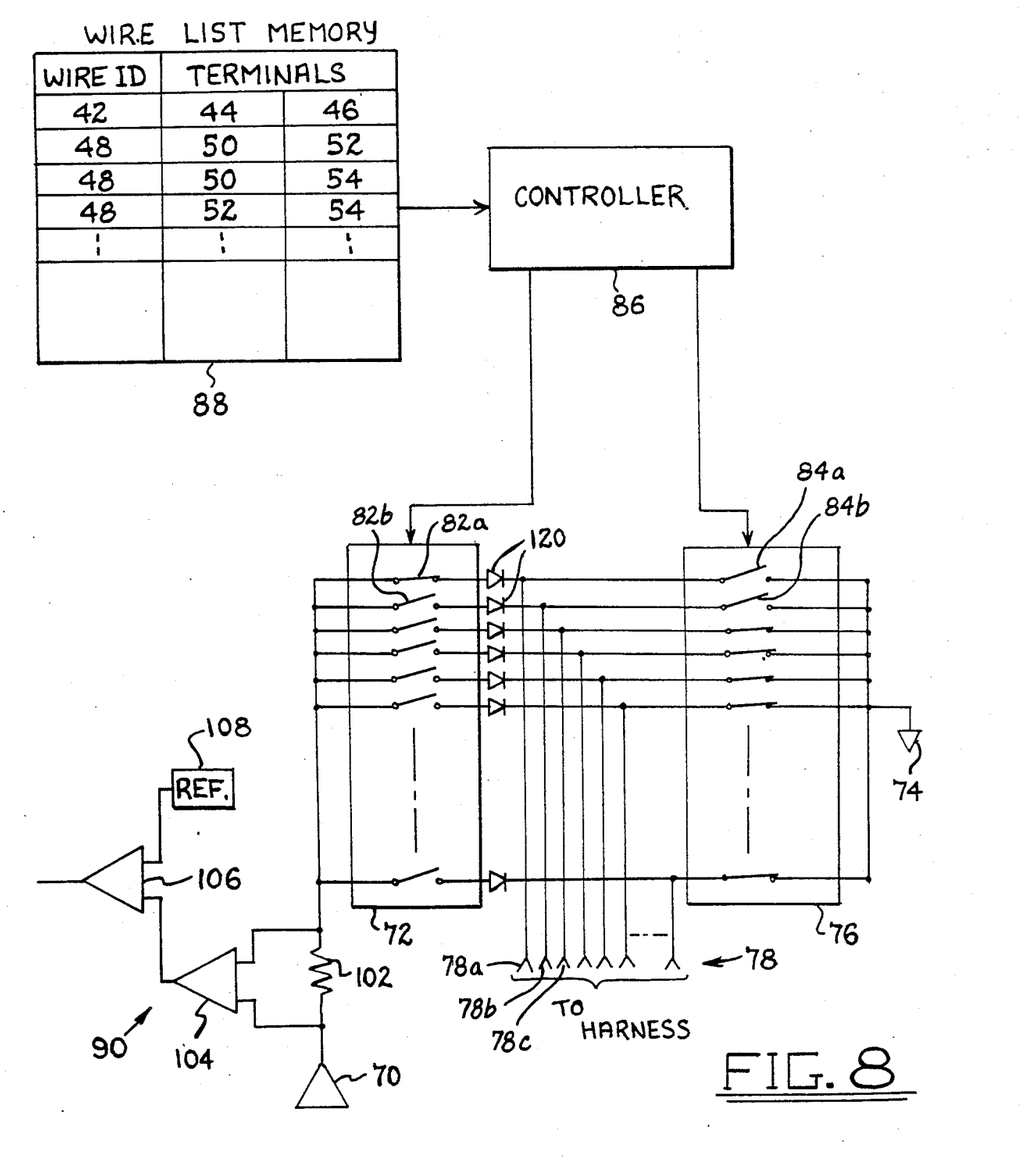
FIG. 8 is a diagram similar to FIG. 7 illustrating an operating condition for performance of a short circuit test on a circuit of the type shown in FIG. 2.

FIG. 8 illustrates performance of a short circuit test on wire 42. The purpose of the short circuit test is to detect any shorts in wire 42 to other wires or terminals of the wiring harness.

The short test is performed on wire 42 by operating controlled conduction path 82a to its conductivity state, and all other controlled conduction paths of the current sourcing means to their non-conductivity states, by operating all controlled conduction paths of the current sinking means simultaneously to their conductivity states, and then by operating controlled conduction paths 82b, 84b to their non-conductivity states.

In this test only one terminal of wire 42 is connected to the current source, and the other is left floating. Because terminal 46 is left floating the only possible path for current flow from terminal 44 will be if there is a short from wire 42 to another of the other terminals in the wiring harness. Since all the other terminals of the wiring harness are connected to the current sink, the presence of a short will result in current flow which can be detected by the current sensing means 90.

A short can occur for any reason, such as an actual fault in the wiring harness or by a misplaced wire. Whatever the reason, the affected circuit can be identified, once the presence of a short has been ascertained, by making non-conductive all the controlled conduction paths of the current sinking means and then making each one conductive, one at a time, until the particular one causing the short is identified. Even though one short is identified, all terminals should be checked in this way, because there might be multiple shorts.

Figure 9:
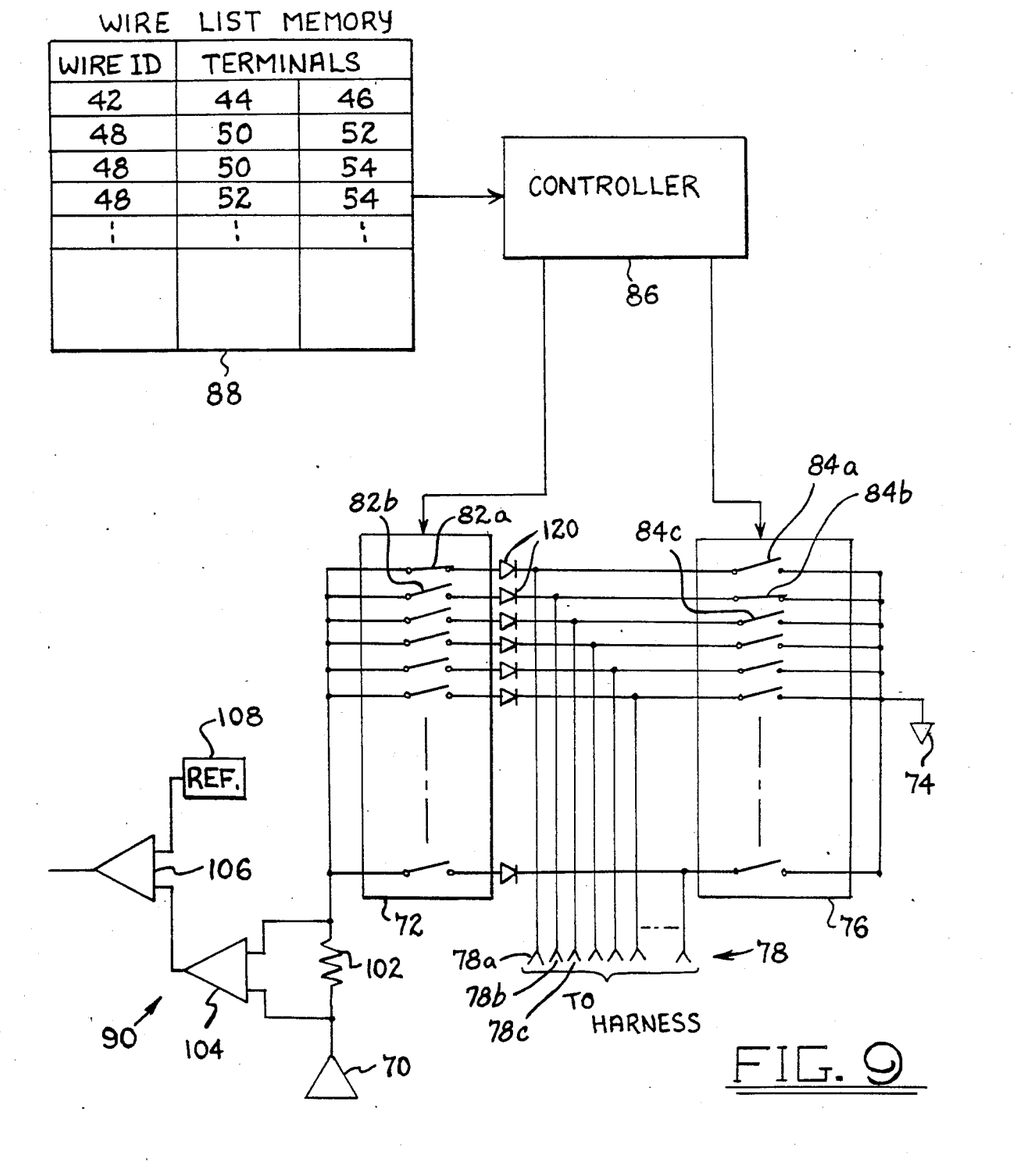
FIG. 9 is a schematic diagram illustrating an operating condition for performance of an open circuit test on a circuit like that shown in FIG. 3.

In the case where a branch circuit such as that in FIG. 3 is to be tested, the open test is performed in an analogous manner to that described for wire 42, as shown by FIG. 9. One of the terminals 50 is connected to the current source through the operation of the corresponding controlled conduction path of the current sourcing means to its conductivity condition while all other controlled conductivity paths of the current sourcing means are made non-conductive. Continuity to the remaining terminals of the particular wire under test (such as 52 and 54 for wire 48) is checked by operating the corresponding particular controlled conduction paths of the current sinking means, one at a time, to their conductivity states while all other paths 84 remain non-conductive. In the case of the illustrated example, the controlled conduction path 84b is first made conductive, and the presence or absence of current sensed. (This is the condition shown by FIG. 9.) Then it is made non-conductive while the controlled conduction path 84c is operated to its conductivity state and the presence or absence of current sensed.

Figure 10:
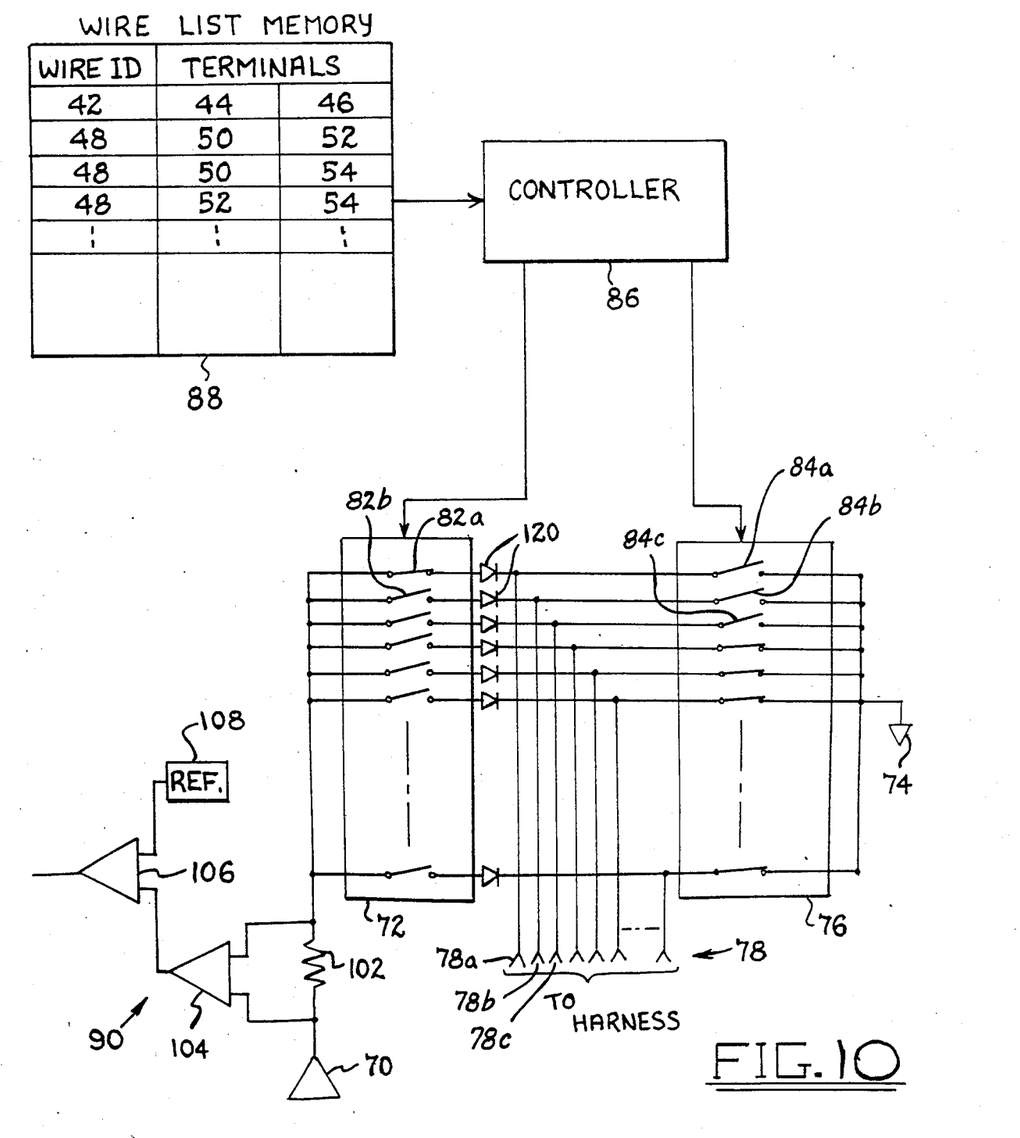
FIG. 10 is a schematic diagram illustrating an operating condition for performing a short circuit test on a circuit of a type shown in FIG. 3.

A short test on a branch circuit such as in the example is conducted as follows with reference to FIG. 10. It's analogous to the two-ended single wire short test described in FIG. 8. The controlled conduction path 82a is operated to its conductivity state while all other controlled conduction paths of the current sourcing means remain in their non-conductivity states. The controlled conduction paths of the current sinking means to which all terminals of the branch circuit in the harness under test are connected are operated to their non-conductivity states (84a, 84b, 84c for the example) after all controlled conduction paths of the current sinking means were simultaneously operated to their conductivity states. Consequently source current will flow only if there is a short from terminal 50 of the harness to one of the harness terminals other than the remaining terminals (52, 54 in the example) of the wire under test. Hence a detection of current flow will indicate a short. The particular terminal involved is identified by opening all conductive controlled conduction paths of the current sinking means, and then closing them one at a time, (skipping 84a, 84b, 84c) until the particular terminal (or terminals in the case of multiple shorts) causing the short is identified.

In the case of a branch circuit it may also be desirable to conduct multiple open and short tests in a manner analogous to that described above for the single wire open and short tests.

Testing of a circuit which contains a diode such as the example of FIG. 4 requires a bi-directional test. This is because a diode appears equivalent to a short circuit during forward conduction and an open circuit when reverse conduction is attempted.

It is also possible to test for the amount of resistance in a circuit, for example where a circuit contains a resistor such as shown in FIG. 5. This is where it now becomes appropriate to discuss the current sensing means 90 in greater detail.

Referring to FIG. 6 the current sensing means is shown to comprise a resistance 102 in the path from current source 70 to the controlled conduction paths 82 of current sourcing means 72. When current flows from the current source to the current sourcing means, a voltage is created across resistance 102 in proportion to the magnitude of current flow. This can be detected by a differential amplifier 104 whose output is connected to one input of a comparator 106. The other input of comparator 106 is connected to a variable reference source 108 which may be set to a particular level over a range of levels.

The purpose of reference source 108 is to set a reference threshold level for comparator 106 against which the current signal detected by differential amplifier 104 is measured. The output of comparator 106 provides an indicator as to whether the magnitude of detected current is above or below the threshhold level set by reference 108.

For open and short tests, the level of the output of the reference 108 is set accordingly. In the case of an open circuit test, the current sensing means operates such that in the presence of current flow from the current source the output of comparator 106 provides an indication of continuity. In the absence of current, the output of comparator 106 provides an open circuit indicator.

In the case of a short circuit test, the presence of current causes the comparator 106 to provide a short circuit indicator while the absence of current causes no such indicator to be given.

In the case of a diode test, a check for conductivity in the forward direction which gives rise to current flow, will provide a correct conductivity indication while in the reverse direction, the absence of current flow will provide the correct open indication.

In the case of a resistance being measured, the magnitude of current signal detected by differential amplifier 104 is correlated with the magnitude of the resistance, and the current sensing means provides an indication depending upon whether that level is above or below a threshhold established by the reference 108. It is also possible for a measurement of the resistance magnitude to be obtained directly from the output of differential amplifier 104.

It is to be appreciated that the current sensing means is a preferred one but that other types of current sensing means may be utilized for detection purposes. The apparatus of the present invention can be utilized to test a completed harness or it can be utilized during the harness fabrication process. Especially during the fabrication process, it is desirable to utilize multiple repeat testings of each circuit. This is because during the assembly process a wire being placed into the harness could momentarily brush against the proper terminal while ultimately being incorrectly connected to another terminal.

Moreover, it is preferable to utilize both forward and reverse testing for all tests so that each one of the terminals of any circuit is successively connected to the current source checked for continuity and shorts. While multiple tests on a wire does add to the checking time, the use of electronic devices such as the microprocessor based system enables the testing to be performed extremely rapidly and indeed even more so than the manual assembly procedures for fabricating of the wiring harness or the reaction times of individuals monitoring a test.

It is also to be noted that alternate procedures may be utilized for detecting a short. While it is important for each individual terminal to be checked individually one at a time for a short, it is possible to utilize a successive approximation technique to identify and zero-in on a particular short circuit.

In a particular operating program for a microprocessor based system, a sequence of testing may comprise first an open circuit test on an individual wire followed by a short circuit test. Where the format of wire identification is as shown, it is especially desirable that the wires which constitute a branch circuit be organized as a family so that in the execution of the operating program all the termination points of a family constituting a branch are consecutive in memory. This promotes a faster operating speed for the tester. In an electronic microprocessor based version the current sourcing means may comprise serial-to-parallel peripheral drivers, using diodes 120 at the output of each controlled conduction path in order to block any reverse current which might try to flow back into the current sourcing means. The current sinking means may comprise latched four bit drivers with open collectors. The current sink is also typically referenced to ground.

The foregoing has described principles of the present invention. These principles are applicable to various physical embodiments of the invention within the scope of the following claims.

We claim:

1. Means for testing individual circuits of a wiring harness wherein each individual circuit is intended to be electrically independent of the others and each such individual circuit comprises two or more termination points, said testing means comprising a plurality of test points, each for connection to a corresponding particular one of the termination points of a harness' circuits, a current source for supplying source current, a current sourcing means for selectively sourcing current from said current source to said test points and thereby selectively to a harness' termination points, a current sink, current sinking means for selectively sinking current from said test points and hence selectively from a harness' termination points, means for operating said current sourcing means and said current sinking means to selectively perform open circuit and short circuit tests on the individual circuits of a harness, said current sourcing means comprising a plurality of independent controlled conduction paths, each containing its own independent controlled conduction device operably coupled from said current source to a corresponding particular one of said test points, said current sinking means comprising a plurality of independent controlled conduction paths, each containing its own independent controlled conduction device operably coupled from a corresponding particular one of said test points to said current sink, means for operating each of said independent controlled conduction devices selectively to conductivity and non-conductivity states independently of the other independent controlled conduction devices, means for performing an open circuit test on an individual circuit of a harness by operating to the conductivity state the corresponding particular controlled conduction device of said current sourcing means to which a particular one of the termination points of the particular individual circuit under open circuit test is connected, by also operating to the conductivity state the corresponding particular controlled conduction device of said current sinking means to which another of the termination points of the particular individual circuit under open circuit test is connected, and by also operating to their non-conductivity states at least all others of said controlled conduction devices to which termination points of the harness under test are connected, means for performing a short circuit test on an individual circuit of a harness by operating to the conductivity state the corresponding particular controlled conduction device of said current sourcing means to which a particular one of the termination points of the individual circuit under short circuit test is connected, by also concurrently operating to their non-conductivity states the corresponding particular controlled conduction devices of said current sinking means to which all other termination points of the particular individual circuit under short circuit test are connected, by also concurrently operating to their non-conductivity states at least all other controlled conduction devices of said current sourcing means to which the remaining termination points of the harness under test are connected, and by also concurrently operating to their conductivity states at least all other controlled conduction devices of said current sinking means to which said remaining termination points of the harness under test are connected, and current sensing means for sensing current flow from said current source during open circuit and short circuit tests for providing an open circuit indicator signal for a particular individual circuit under open circuit test if there is no current flow during open circuit test and for providing a short circuit indicator signal for a particular individual circuit under short circuit test if there is current flow during short circuit test.

2. Testing means as set forth in claim 1 in which said means for performing an open circuit test comprises means for operating to their non-conductivity states all others of said controlled conduction devices to which said termination points of the harness under test are connected even if not all of those devices are actively connected to terminals of the wiring harness under test.

3. Testing means as set forth in claim 1 in which said means for performing a short circuit test comprises means for operating to their non-conductivity states all other controlled conduction devices of said current sourcing means and to their conductivity states all other controlled conduction devices of said current sinking means if not all of said other of said controlled conduction devices of said current sourcing means and not all other controlled conduction devices of said current sinking means are actively connected to terminals of the wiring harness under test.

4. Testing means as set forth in claim 1 in which said current sourcing means comprises serial-to-parallel peripheral drivers.

5. Testing means as set forth in claim 1 in which said current sinking means comprises latched four bit drivers having open collectors.

6. Testing means as set forth in claim 1 in which said current sensing means comprises a resistor in series from said current source to said current sourcing means and detector means operatively connected across said resistor so that a signal correlated with current flow through said resistor forms a signal which is compared against a reference signal to determine the condition of a circuit under test.

7. Testing means as set forth in claim 6 in which said reference signal is adjustably settable to a particular threshhold level over a range of possible threshhold levels and an indicator signal is given when the signal detected from the detector means exceeds the reference signal.

8. Testing means as set forth in claim 1 in which said means for performing a short circuit test on an individual circuit comprises means for operating said all other controlled conduction devices of said current sinking means simultaneously to their conductivity states and then operating to their non-conductivity states all controlled conduction devices of said current sinking means to which termination points of the individual circuit under test are connected.

9. Testing means as set forth in claim 1 including a memory which contains identification for the individual circuits of a harness under test arranged in sequence by individual circuit, including an identification of termination points for each individual circuit organized as a group in memory, and all such groups being arranged consecutively in memory.

10. Testing means as set forth in claim 1 in which said means for performing said short circuit test on an individual circuit includes means responsive to a short circuit indicator signal from said current sensing means for continuing the short circuit test by selectively operating to their non-conductivity states, according to a desired schedule, those controlled conduction devices of said current sinking means which had been placed in their conductivity states for performing the short circuit test, so as to identify those particular termination points of the harness which exhibit a short to said particular one of the termination points of the individual circuit under short circuit test.

* * * * *